(12) United States Patent
Leggett

(10) Patent No.: US 6,771,935 B1
(45) Date of Patent: Aug. 3, 2004

(54) WIRELESS BUS

(75) Inventor: Nickolaus E. Leggett, Reston, VA (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/166,610

(22) Filed: Oct. 5, 1998

(51) Int. Cl.$^7$ ................................................. H04B 7/00
(52) U.S. Cl. ................... 455/66.1; 455/90.3; 455/575.7; 361/788; 361/796
(58) Field of Search ......................... 455/66, 90, 562.1, 455/74, 67.12, 300, 333, 41.2, 151.2, 41, 575.1, 550.1, 301, 66.1, 67.15, 81, 575.7, 90.3, 103; 359/163, 152, 173, 153, 222; 330/286, 65, 56, 66, 289, 295; 257/80–85, 98; 385/53, 24, 89, 49, 91, 129, 130; 250/551, 227.11, 227.23; 342/368, 372, 700; 343/777, 727, 771, 772, 754, 795; 361/784–804

(56) References Cited

U.S. PATENT DOCUMENTS

| | | | | |
|---|---|---|---|---|
| 4,063,083 A | * | 12/1977 | Cathey et al. | ............... 250/199 |
| 4,358,858 A | * | 11/1982 | Tamura et al. | ............... 455/607 |
| 4,393,515 A | * | 7/1983 | De Neumann | ............... 455/606 |
| 4,499,607 A | * | 2/1985 | Higgins | ....................... 455/606 |
| 4,499,608 A | * | 2/1985 | Broockman et al. | ........ 455/607 |
| 4,682,323 A | * | 7/1987 | Corfield et al. | ................. 370/4 |
| 4,703,474 A | * | 10/1987 | Foschini et al. | ............... 370/18 |
| 4,720,634 A | * | 1/1988 | D'Auria et al. | ............. 250/551 |
| 4,850,044 A | * | 7/1989 | Block et al. | ................. 455/607 |
| 5,249,270 A | | 9/1993 | Stewart et al. | ............... 395/200 |
| 5,335,361 A | * | 8/1994 | Ghaem | ........................ 455/66 |
| 5,467,341 A | | 11/1995 | Matsukane et al. | ........... 370/17 |
| 5,488,380 A | * | 1/1996 | Harvey et al. | ............... 342/368 |
| 5,488,682 A | * | 1/1996 | Sauter et al. | .................. 385/53 |
| 5,579,346 A | * | 11/1996 | Kanzaki | ...................... 375/344 |
| 5,608,723 A | * | 3/1997 | Felsenstein | ................. 370/335 |
| 5,621,913 A | * | 4/1997 | Tuttle et al. | .................. 455/90 |

OTHER PUBLICATIONS

R.C. Dorf, *The Electric Engineering Handbook*, pp. 1552–1553 concerning CDMA (ISBN 0-8493-0185-8, CRC Press,© 1993).

* cited by examiner

*Primary Examiner*—Edward F. Urban
*Assistant Examiner*—C. Chow
(74) *Attorney, Agent, or Firm*—Michael Blaine Brooks, P.C.; David A. Cordeiro; V. Lawrence Sewell

(57) ABSTRACT

In order to avoid mechanical assembly problems and transmission of undesired electrical currents among circuit cards or boards in a telecommunications switch or similar digital device, a conventional hard-wired midplane bus is replaced by a wireless bus. The wireless bus includes a radio frequency or light wave transceiver on each card. Antennas on respective cards can either be oriented within direct line-of-sight of each other, or can project into a waveguide which directs the transmitted signals past all the other antennas. For example, the waveguide may be a metal enclosure which surrounds all the cards. Alternatively, respective aligned apertures in the cards can define a continuous transmission path. A data rate exceeding 1 megabit per second and a transmission power on the order of 1 milliWatt are preferred, since the bus is intended for use within a single switch housing. Radio frequencies in the middle to high microwave range or light frequencies in the visible range are preferred for providing sufficient bandwidth and to facilitate servicing.

10 Claims, 2 Drawing Sheets

WIRELESS BUS

FIELD OF THE INVENTION

The present invention relates generally to wireless interconnection of different circuits within a single housing and, more particularly to the use of radio waves and/or light to transfer signals between a plurality of circuit boards in a telecommunications switch or computer housing. The use of a wireless bus across an office or building is known, but use of a wireless bus within a single equipment housing provides advantages not previously appreciated.

BACKGROUND

A telecommunications switch typically has a housing containing a structural framework or "chassis" and an interconnecting device known as a "backplane" or "midplane." A backplane engages with other circuits on one side; a midplane engages with other circuits on its two sides. The framework defines a plurality of slots. Each slot is adapted for sliding in of a circuit board or card, and for alignment of the card for engagement with the midplane or backplane, typically at a right angle to the midplane or backplane. For example, the midplane can have mounted on it an electrical connector which has a plurality of metal pins which make electrical contact with corresponding sockets or terminals on the card being inserted. Alternatively, the pins can be on the card and the sockets can be on the midplane. However, a major disadvantage of this structure is that the metal pins are vulnerable to bending during insertion of the card, particularly if the pins and sockets are not perfectly aligned. Often, it is difficult to determine visually, during the card insertion process, whether such alignment is proper. Once a pin is bent, the card cannot be properly engaged with the midplane, necessitating repair or replacement of the card or midplane. which is a labor-intensive process. Furthermore, direct electrical contact, between circuit elements on the midplane and circuit elements on the card, means that damaging electrical surges or transients and electrical noise can readily be transmitted between the midplane and the card or cards.

SUMMARY OF THE INVENTION

Accordingly, it is an object of the present invention to provide a wireless bus to transmit signals between a midplane or backplane and a plurality of cards, or directly among a plurality of cards within a single housing, to thereby electrically isolate the cards from each other.

Briefly, this is accomplished by replacing the wired connections with a radio channel or an optical signal channel between each card and the midplane or, if no midplane is used, directly between each pair of cards. Thus, there are no pins to be bent. Any probes or antennas used do not physically contact the other cards or chassis. The cards can be easily inserted into or removed from the chassis. Field upgrades to the telecommunications switch or other swaps or exchanges of cards can be carried out quickly and easily.

BRIEF FIGURE DESCRIPTION

Figure 5:
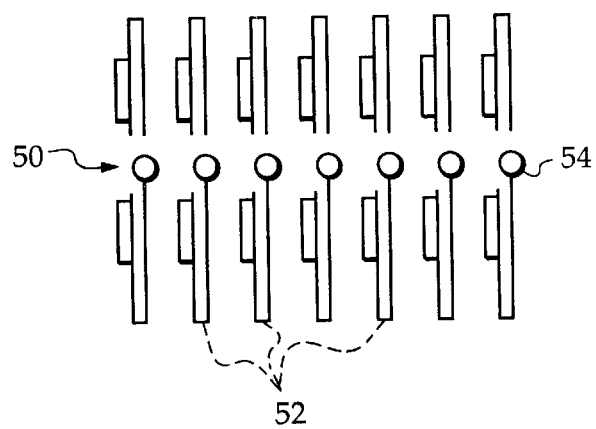
Figure 4:
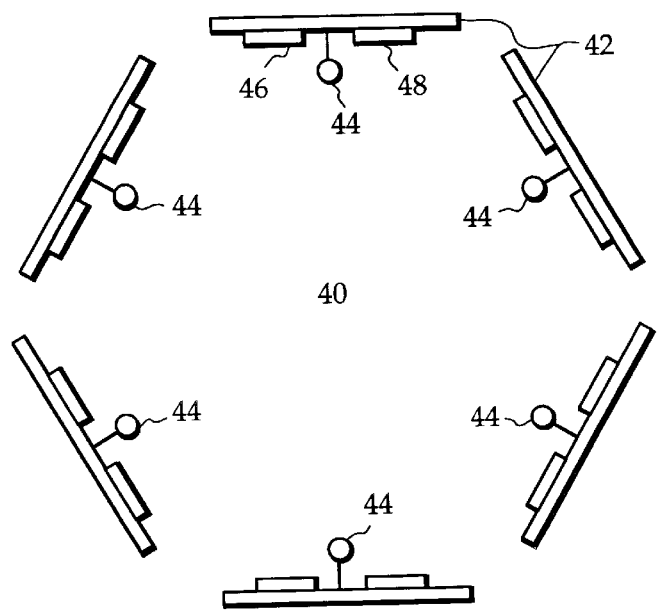

FIG. 4 illustrates a "polygon" configuration, in which the cards each have a radio frequency or optical frequency transceiver pointed toward a central space, and the cards are arranged along a periphery of the central space; and FIG. 5 is a cross-sectional view illustrating how respective central holes could be formed in a plurality of cards to define a transmission path for a plurality of radio frequency transceivers.

BEST MODE FOR CARRYING OUT THE INVENTION

Figure 1:
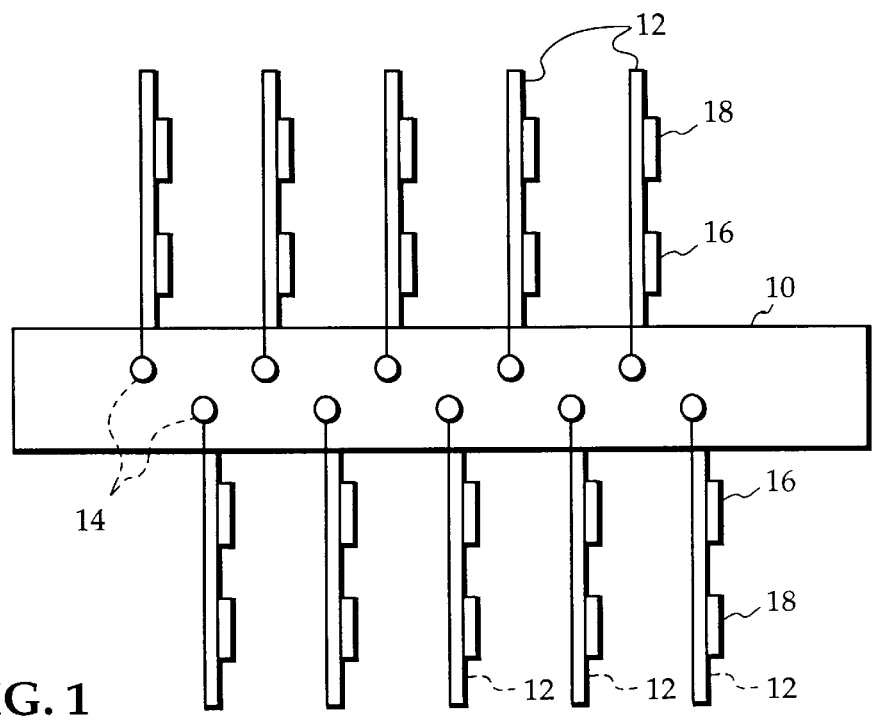
FIG. 1 illustrates a first embodiment of the invention, in which each card has a radio frequency antenna or probe which extends into a common waveguide, serving as the midplane for the digital switch or other electrical apparatus.

FIG. 1 schematically illustrates a first embodiment of the invention, in which a central waveguide 10 serves as a pathway for radio frequency (RF) signals transmitted among a plurality of circuit boards or cards 12 forming part of a telecommunications switch or similar digital device. The waveguide in effect replaces the midplane used in the prior art hard-wired devices. Although a waveguide having a rectangular cross-section is shown, any configuration which reliably transmits the RF signals is suitable. Each card 12 has a probe or antenna 14 which projects into waveguide 10. Each card 12 may have mounted thereon a plurality of electrical components such as an RF transceiver chip 16, and processing or other integrated circuit chips 18. No specific RF transceiver chip is preferred. Frequencies in the middle to high microwave range would be most useful because of the high bandwidth available and because the small wavelengths are compatible with the use of narrow waveguides and cavities. The communications occur in a small confined space, so transmitting power levels on the order of 1 milliwatt would be sufficient.

Preferably, each card communicates with every other card by a respective spread spectrum radio channel. If different frequencies are used for respective channels, the frequency used by each card could be set by setting selection switches (not shown) on the card at the time of assembly of the device. Alternatively, multiple channels can be provided within a single common frequency band by using a TDMA (Time Division Multiple Access) or CDMA (Code Division Multiple Access) communications protocol. In a major telecommunications switch, one would expect to have mane than 100 communications channels; in a smaller computer or digital controller, fewer than 100 channels would suffice. The number of channels desired rises exponentially as the number of cards increases, unless a central hub or routing circuit is used.

An optical frequency version of this wireless bus could be produced by replacing tie RF transmitters with optical signal sources such as Light Emitting Diodes (LED's) or lasers, the RF receivers with optical detectors, and the radio frequency waveguide with an optical enclosure or cavity which transmits and internally reflects the lightwave frequencies used. Visible band light waves are preferred, because service technicians can easily confirm that a given transmitter is in operation. However, frequencies outside the visible range, e.g. infrared or ultraviolet, could also be used. Interference among respective light wave channels can be avoided by the use of filters on the detectors or receivers to block undesired frequencies. Use of light as the carrier medium permits high data rates, exceeding 1 megabit per second, so it would be feasible to use a "bucket brigade" transport of data from card to card through the switch. Alternatively, routing through a central hub card within the switch could be used. Various modulation techniques, such as on/off keying to send digital codes, could be used.

Figure 2:
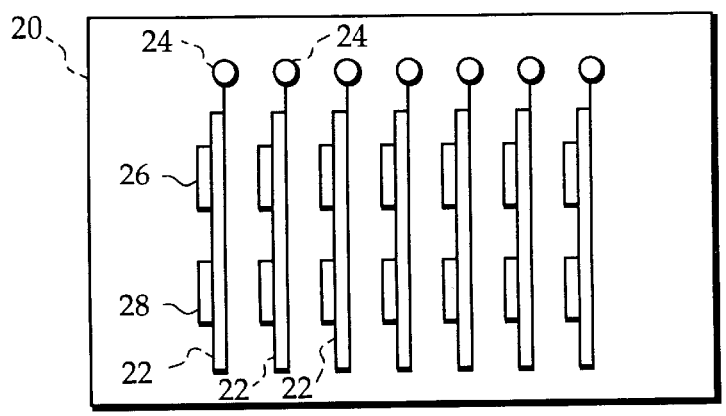
FIG. 2 illustrates a second embodiment, in which the cards and their respective antennas are contained within a conducting enclosure, and communicate with each other by reflected and directly transmitted radio frequency waves.

FIG. 2 schematically illustrates another embodiment of the invention, in which an enclosure 20 of conducting material, such as metal, completely surrounds a plurality of cards 22 and their respective RF antennas 24. The enclosure reflects the radio waves transmitted, ensuring that cards which are separated by intervening objects, and/or which are not within RF line-of-sight, can communicate with each other directly. As in the first embodiment, each card 22 has a Deceiver 26 and other component(s) 28 mounted on it.

Figure 3:
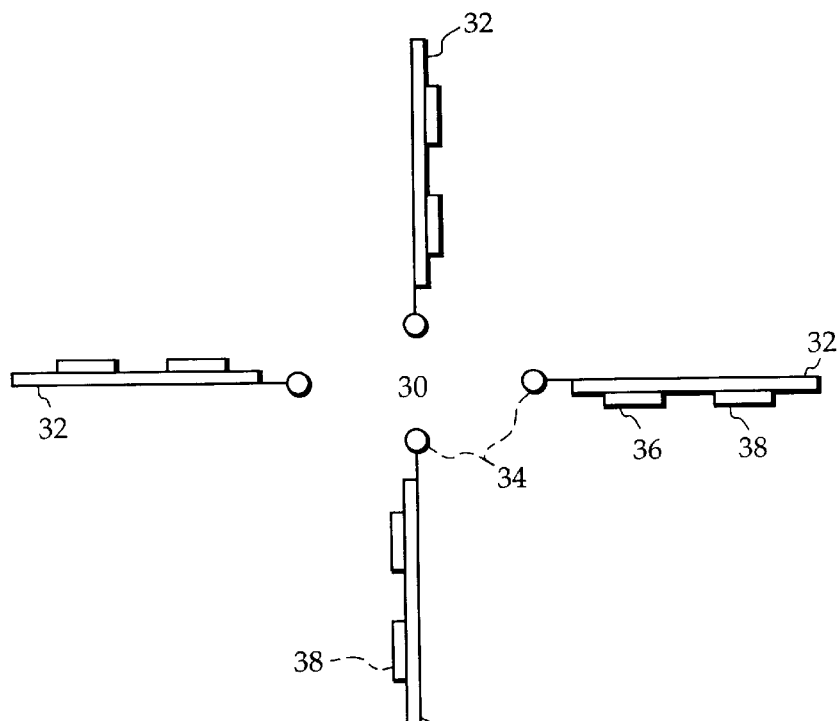
FIG. 3 illustrates a "star" configuration, in which the cards each have an antenna in a central space, with respect to which the cards are arranged radially.

FIG. 3 shows a "star" configuration of cards 32 which are arranged radially around a central space 30, so that there is a direct line-of-sight transmission path among the respective RF antennas or optical transmitter/detector means 34 projecting from the ends of the respective cards. As in the previously discussed embodiments, electrical components 36, 38 are mounted on each card.

FIG. 4 illustrates a "polygon" configuration, in which the cards 42 each have a radio frequency antenna 44 or optical frequency transceiver pointed toward a central space 40, and the cards are arranged along a periphery of the central space 40. Although a generally hexagonal configuration is shown, any configuration which provides line-of-sight communication among transceivers of the respective cards is suitable.

FIG. 5 schematically illustrates a fifth embodiment, in which respective cards 52 are each formed with respective apertures which are aligned to provide a common line-of-sight axis or pathway 50 for signal transmission among respective antennas or transceivers 54. The size of each aperture should equal at least one wavelength of the lowest carrier frequency being transmitted through the aperture, to avoid undesired diffraction effects.

Various changes and modifications are possible within the scope of the inventive concept. For example, although RF antennas have been illustrated as separate elements mounted directly on and extending from the cards, antennas could be connected by cable to each card, or a conductive track formed on a card could function as an antenna. A one-to-one correspondence between transceivers and cards is not essential; separate portions of a single card could be provided with their own transceivers. Therefore, the invention is not limited to the specific embodiments shown and described, but rather is defined by the following claims.

What is claimed is:

1. A microwave interconnection device comprising:

a waveguide for providing a microwave pathway for a plurality of electromagnetic microwave signals, wherein the waveguide comprises a plurality of circuit card interfacing slots; and a plurality of circuit cards wherein each of the plurality of circuit cards comprises a microwave radio transceiver and a waveguide interfacing side wherein each waveguide interfacing side is proximate and electrically connected to a microwave antenna; wherein each of the plurality of circuit cards is oriented with the waveguide interfacing side of each of the plurality of circuit cards proximate to a member of the plurality of circuit card interfacing slots of the waveguide to an extent sufficiently causing the microwave antenna of each of the plurality of circuit cards to project into the waveguide;

whereby the plurality of electromagnetic microwave signals are transmitted among the plurality of circuit card microwave antennas via the microwave radio frequency pathway provided by the waveguide.

2. The microwave interconnection device of claim 1 wherein the plurality of electromagnetic microwave signals are encoded and decoded according to Time Division Multiple Access.

3. The microwave interconnection device of claim 1 wherein the plurality of electromagnetic microwave signals are encoded and decoded according to Code Division Multiple Access.

4. A microwave interconnection device comprising:

a waveguide for providing a microwave pathway for a plurality of electromagnetic microwave signals, wherein the waveguide comprises a plurality of circuit card interfacing slots; and a plurality of circuit cards wherein each of the plurality of circuit cards comprises a microwave radio transceiver and a waveguide interfacing side wherein each waveguide interfacing side is proximate and electrically connected to a microwave probe; wherein each of the plurality of circuit cards is oriented with the waveguide interfacing side of each of the plurality of circuit cards proximate to a member of the plurality of circuit card interfacing slots of the waveguide to an extent sufficiently causing the microwave probe of each of the plurality of circuit cards to project into the waveguide;

whereby the plurality of electromagnetic microwave signals are transmitted among the plurality of circuit card microwave probes via the microwave radio frequency pathway provided by the waveguide.

5. The microwave interconnection device of claim 4 wherein the plurality of electromagnetic microwave signals are encoded and decoded according to Time Division Multiple Access.

6. The microwave interconnection device of claim 4 wherein the plurality of electromagnetic microwave signals are encoded and decoded according to Code Division Multiple Access.

7. A radio frequency interconnection device comprising:

(a) a waveguide comprising a plurality of interfacing slots, each interfacing slot adapted to physically receive a radio frequency (RF) antenna, wherein the waveguide supports an RF signal comprising at least one communications channel propagating therein; and (b) a plurality of circuit cards, each circuit card comprising:

(i) one or more electrical components comprising a radio frequency transceiver, and (ii) at least one RF antenna adapted to project into the waveguide via an interfacing slot and operatively engage the RF signal; wherein said one or more electrical components external to the waveguide are substantially shielded from the RF signal.

8. The interconnection device of claim 7, wherein the plurality of interfacing slots are longitudinally arrayed along one or more sides of the waveguide.

9. The interconnection device of claim 8, wherein the one or more sides of the waveguide form a rectangular cross-section.

10. The interconnection device of claim 7, wherein the interconnection device is adapted to operatively couple a midplane of a telecommunications switch to the plurality of switch circuit cards.

* * * * *